United States Patent [19]
Niino et al.

[11] Patent Number: 5,380,370
[45] Date of Patent: * Jan. 10, 1995

[54] METHOD OF CLEANING REACTION TUBE

[75] Inventors: Reiji Niino; Yoshiyuki Fujita, both of Kofu; Hideki Lee, Nirasaki; Yasuo Imamura, Yokohama; Toshiharu Nishimura, Kofu; Yuuichi Mikata, Kawasaki; Shinji Miyazaki, Yokkaichi; Takahiko Moriya, Yokohama, all of Japan; Katsuya Okumura, Poughkeepsie, N.Y.

[73] Assignee: Tokyo Electron Limited, Tokyo, Japan

[ * ] Notice: The portion of the term of this patent subsequent to Mar. 15, 2011 has been disclaimed.

[21] Appl. No.: 54,229

[22] Filed: Apr. 30, 1993

[51] Int. Cl.6 ............... B08B 7/00; B08B 9/00
[52] U.S. Cl. ............... 134/22.11; 134/2; 134/3; 134/22.1; 134/22.12; 134/22.18; 134/37; 134/42; 156/643; 156/646
[58] Field of Search ............ 134/2, 3, 22.1, 22.11, 134/22.12, 22.18, 37, 42; 156/643, 646

[56] References Cited
U.S. PATENT DOCUMENTS

| | | | |
|---|---|---|---|
| 4,310,380 | 1/1982 | Flamm et al. | 156/643 |
| 4,568,410 | 2/1986 | Thornquist | 156/643 |
| 5,022,961 | 1/1991 | Izumi et al. | 156/643 |
| 5,116,784 | 5/1992 | Ushikawa | 437/225 |
| 5,254,176 | 10/1993 | Ibuka et al. | 134/2 |

FOREIGN PATENT DOCUMENTS
4157161 5/1992 Japan.

Primary Examiner—Richard O. Dean
Assistant Examiner—Zeinab El-Arini
Attorney, Agent, or Firm—Oblon, Spivak, McClelland, Maier, & Neustadt

[57] ABSTRACT

Prior to formation of a polysilicon film on a wafer, a pre-coat film having a thickness of 1 μm and consisting of polysilicon is formed on the inner wall surface of a reaction tube or the surface of a member incorporated in the reaction tube. A polysilicon film is formed on the wafer at a temperature of 450° C. to 650° C. A cleaning gas containing $ClF_3$ having a concentration of 10 to 50 vol. % is supplied into the reaction tube at a flow rate to an area of an object be cleaned of 750 to 3,500 $SCCM/m^2$ to remove a polysilicon film deposited on the inner wall surface of the reaction tube or the surface of the member incorporated in the reaction tube by etching using the $ClF_3$. In this case, the cleaning gas is supplied while a temperature in the reaction tube is kept at a temperature of 450° C. to 650° C. and in a pressure condition set at the kept temperature such that an etching rate of a polysilicon film by the cleaning gas is higher than an etching rate of quartz constituting the reaction tube or the member incorporated in the reaction tube.

8 Claims, 10 Drawing Sheets

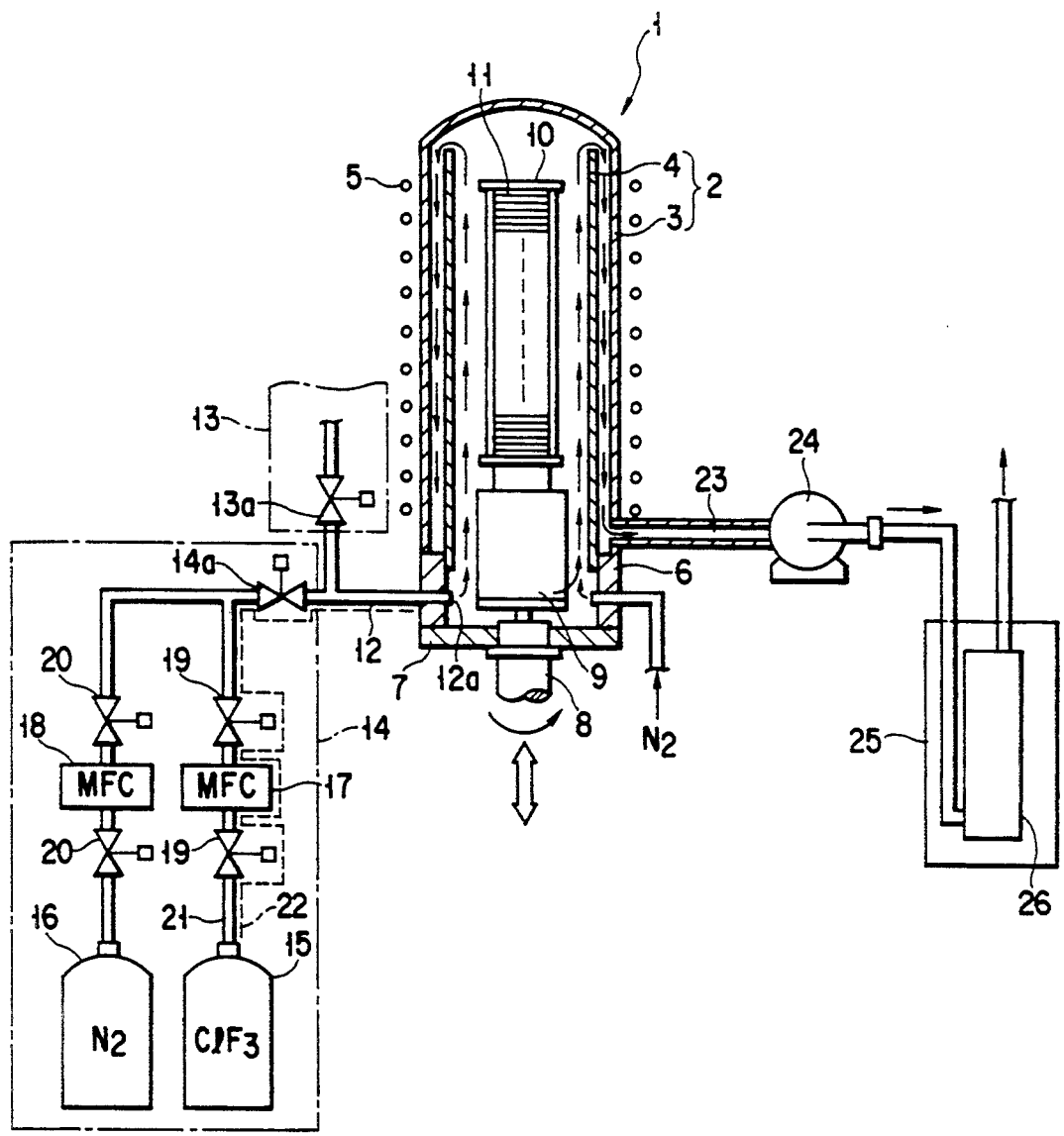
F I G. 1

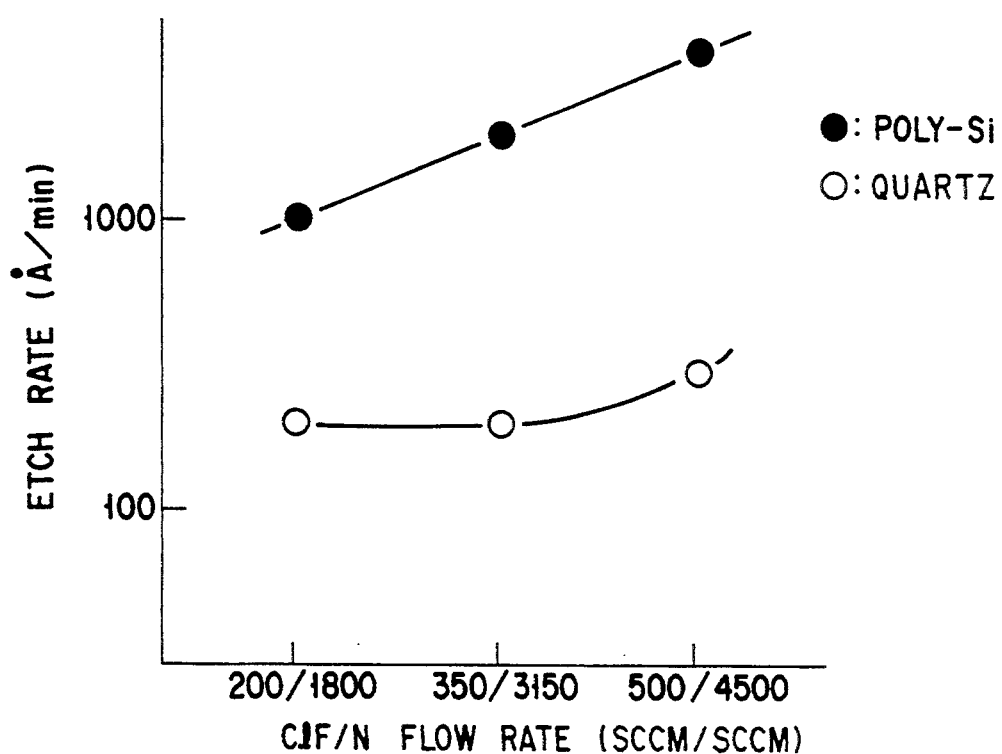
F I G. 3
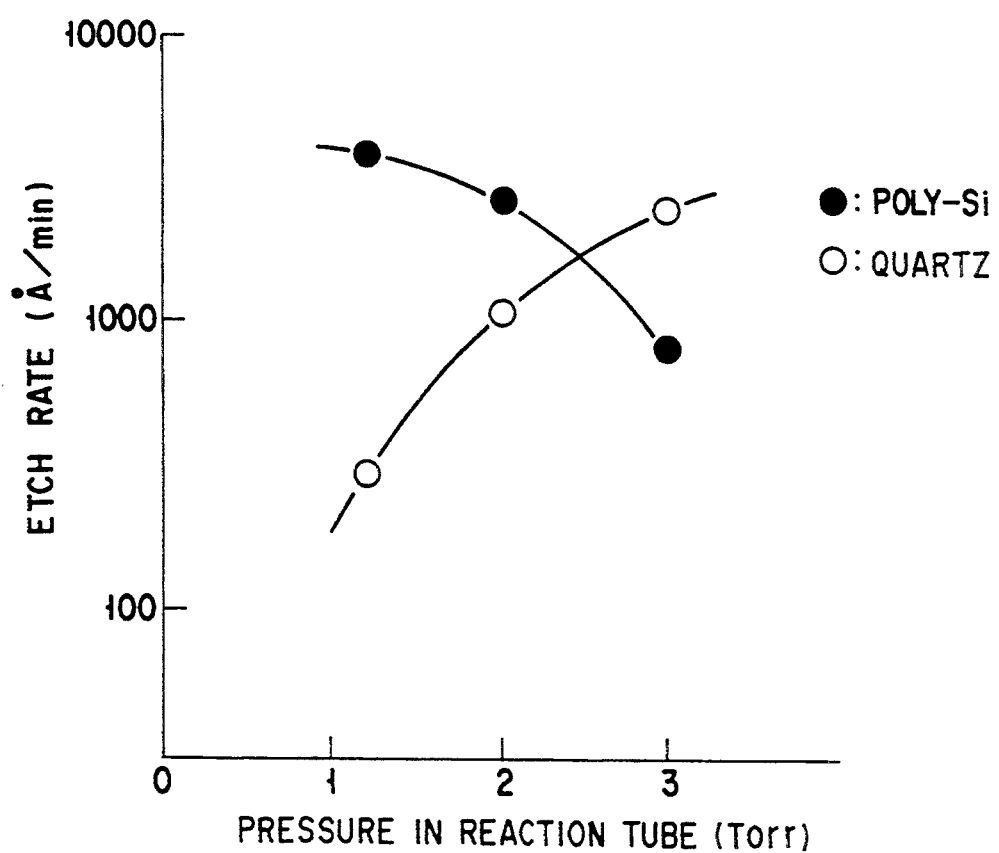
F I G. 4

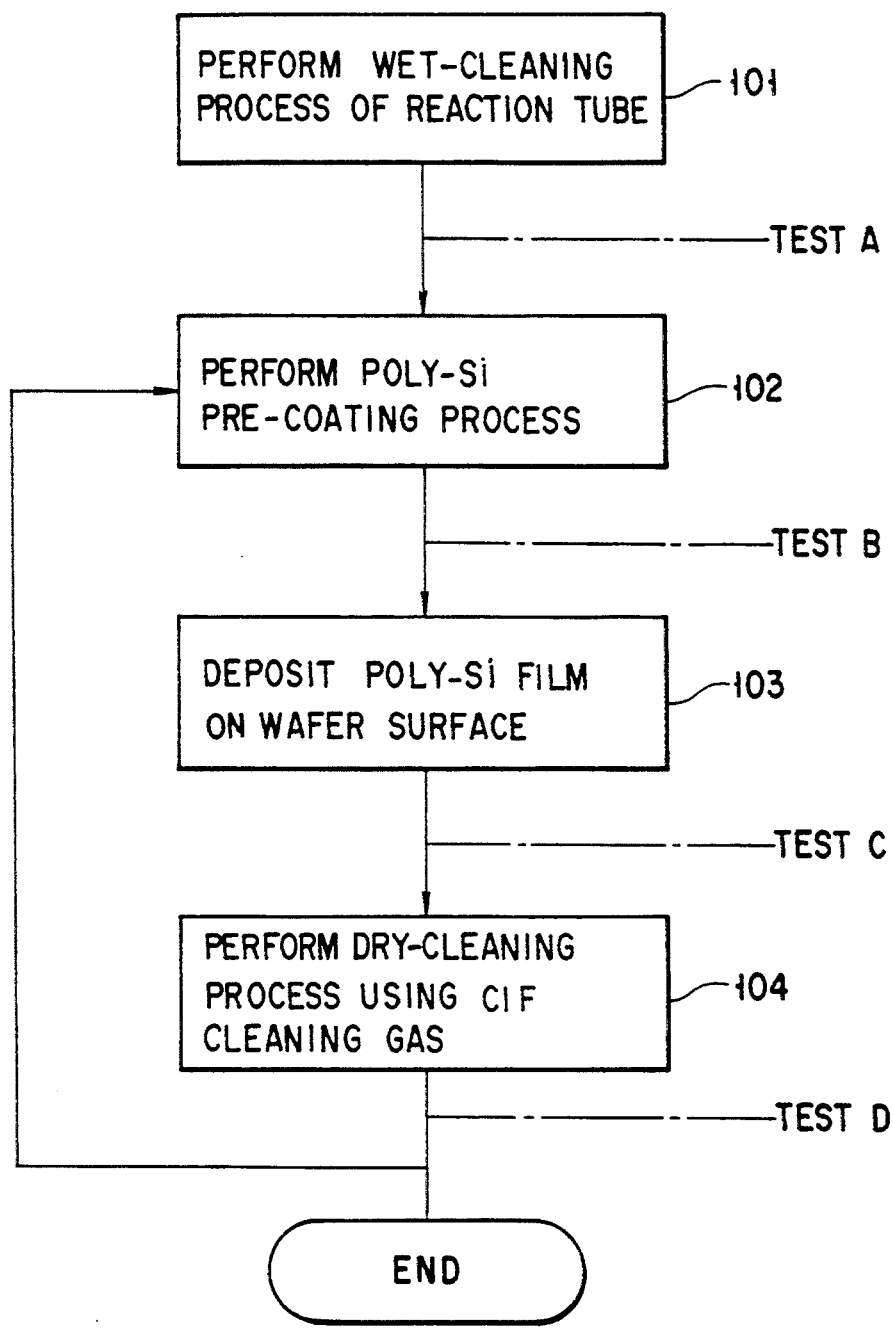
F I G. 10

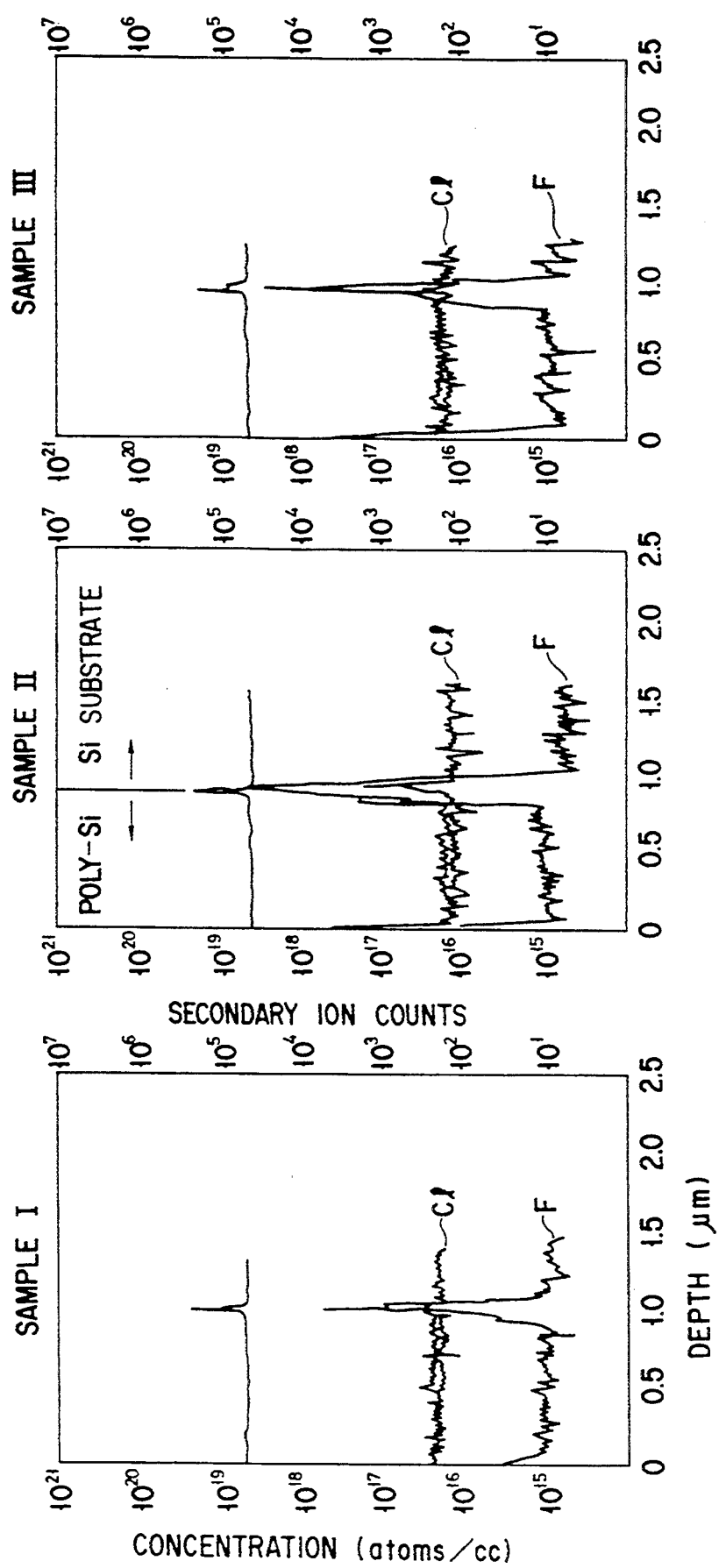

5,380,370

METHOD OF CLEANING REACTION TUBE

BACKGROUND OF THE INVENTION

1. Field of the Invention

The present invention relates to a method of cleaning a reaction tube and, more particularly, to a cleaning method in which polysilicon, silicon nitride, and silicon oxide films deposited inside the reaction tube are removed by a cleaning gas containing $ClF_3$. In addition, the present invention relates to a method of forming a film on the surface of a substrate to be processed.

2. Description of the Related Art

Conventionally, in the steps of manufacturing a semiconductor device, a polysilicon-based film such as a polysilicon film or a silicon epitaxial growth film, a silicon nitride film, or a silicon oxide film is formed on a substrate to be processed such as a semiconductor wafer by low-pressure CVD, atmospheric-pressure CVD, or the like.

For example, in the step of forming a polysilicon-based film, a heat treatment apparatus constituted by arranging a heater around a reaction tube consisting of quartz or the like is generally used. For example, a wafer boat in which a large number of semiconductor wafers are stored is loaded in a reaction tube kept at a predetermined temperature, and reactive gases such as an $SiH_4$ gas, an $SiH_2Cl_2$ gas, an $Si_2H_6$ gas, and an $H_2$ gas are supplied into the reaction tube, thereby performing a film forming process of a silicon (Si)-based film. The loading/unloading operations of semiconductor wafers are generally performed to a reaction tube kept at about a process temperature.

When the above film forming process is performed, a polysilicon-based film is deposited on the reaction tube of the heat treatment apparatus or other quartz jigs. When the thickness of the polysilicon-based film deposited on the reaction tube and the like is increased, it is peeled and scattered. The scattered film pieces are adhered on semiconductor wafers. This is a factor of decreasing the yield of the semiconductor wafers. The above problem is also posed in film forming processes of a silicon nitride film and a silicon oxide film.

The film deposited inside the reaction tube is generally removed to be described below at a predetermined frequency. That is, the temperature in the reaction tube is decreased to about an atmospheric temperature, the reaction tube, the quartz members, and the like are removed, and they are wet-washed with a diluted hydrogen fluoride (HF) solution to remove the deposited film.

In the method of cleaning the inside of the reaction tube according to the wet washing, however, the apparatus must be stopped for a very long time to increase/decrease the temperature in the reaction tube and to remove the reaction tube and the like. Therefore, the operational efficiency of the heat treatment apparatus is disadvantageously degraded.

A system such as a load lock system for always holding a reaction tube and a loading part in a vacuum state in a heat treatment apparatus is proposed. In this case, since the heat treatment apparatus is mostly surrounded by a vacuum chamber, an object subject to cleaned such as a reaction tube consisting of quartz cannot easily be removed from the heat treatment apparatus. In recent years, the diameter of a semiconductor wafer tends to be increased, and the size of a heat treatment apparatus is increased accordingly. In this case, since the sizes of a reaction tube main body, a quartz jig, and the like are increased, they cannot easily be removed from the apparatus to wash them. As described above, in the wet cleaning, the heat treatment apparatus must be disassembled into parts to remove objects to be cleaned. Therefore, the wet cleaning cannot easily cope with an increase in integration density of a semiconductor device and an increase in size of a wafer in recent years.

In order to solve the above problem, dry cleaning in which an etching gas flows into a reaction tube to clean the inside of the reaction tube has been attempted. According to this method, an etching gas such as a carbon tetrafluoride ($CF_4$) gas, a nitrogen trifluoride ($NF_3$) gas, or a sulfur hexafluoride ($SF_6$) gas is supplied to a reaction tube, and a plasma is produced in the reaction tube, so that a film deposited inside the reaction tube is removed by etching. More specifically, it has been reported that cleaning can be performed without producing a plasma by using a chlorine trifluoride ($ClF_3$) gas as an etching gas.

However, as the $ClF_3$ gas has high reactivity, a material such as quartz constituting a reaction tube and a jig incorporated in the reaction tube are etched by the $ClF_3$ gas under a high-temperature condition. For this reason, $ClF_3$ haven't been able to be considered to be used at a temperature of 400° C. or more, and cleaning is generally performed at a temperature of 400° C. or less. Therefore, in the film forming step under a temperature condition of 400° C. or more, and more particularly, 600° C. or more, the temperature in the reaction tube must be decreased to 400° C. or less by spontaneously radiation to perform cleaning using the $ClF_3$ gas. In addition, the temperature in the reaction tube must be reset to restart the film forming step. As a result, the cleaning requires a long time, and the operational efficiency of the heat treatment apparatus is degraded.

As described above, both the conventional wet-cleaning and dry-cleaning methods require cumbersome operations, and a long time is required to perform these methods. For this reason, the methods are not suitable for frequently performing cleaning in the film forming step to always keep the inside of the reaction tube clean. In accordance with an increase in integration density of a semiconductor device in recent years, an operation environment is required to be more clean. However, this requirement cannot easily be achieved by the conventional cleaning methods.

SUMMARY OF THE INVENTION

It is an object of the present invention to provide a cleaning method in which cleaning of the inside of an reaction tube can be safely, efficiently performed for a short time to remove a film deposited inside the reaction tube.

It is another object of the present invention to provide a method of forming a film on a substrate in which dry cleaning using a $ClF_3$ gas is performed under a condition of a high temperature close to a process temperature of a film forming process to clean the inside of a reaction tube for a short time in the film forming step, so that films can be formed in a very clean environment.

That is, according to the present invention, there is provided a method of cleaning an inside of a reaction tube, comprising the steps of:

supplying a cleaning gas containing $ClF_3$ having a predetermined concentration into the reaction tube at a predetermined flow rate to remove a film deposited on an inner wall surface of the reaction tube or a surface of a member incorporated in the reaction tube by etching using the ClF$_3$, wherein the cleaning gas is supplied while a temperature in the reaction tube is kept at not less than 450° C. and in a pressure condition set at the kept temperature such that an etching rate of the film by the cleaning gas is higher than an etching rate of a material of the reaction tube or a member incorporated in the reaction tube.

According to the present invention, there is provided a method of forming a film on an object to be processed, comprising the steps of:

heating a reaction tube;

loading the object in the reaction tube and then supplying a source gas into the reaction tube to form a film on a surface of the object; and unloading the object on whose surface the film is formed and then supplying a cleaning gas containing ClF$_3$ of a predetermined concentration into the reaction tube at a predetermined flow rate to remove the film deposited on an inner wall surface of the reaction tube or a surface of a member incorporated in the reaction tube by etching using the ClF$_3$, wherein the cleaning gas is supplied while a temperature in the reaction tube is kept at not less than a temperature of the heated reaction tube and in a pressure condition set at the kept temperature such that an etching rate of the film by the cleaning gas is higher than an etching rate of a material of the reaction tube or a member incorporated in the reaction tube.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing an embodiment of a vertical heat treatment apparatus to which a method of cleaning a reaction tube according to the present invention is applied;

FIG. 3 is a graph showing relationships between the etching rates of polysilicon and quartz and gas flow rates;

FIG. 4 is a graph showing relationships between the etching rates of polysilicon and quartz and pressures in the reaction tube;

FIG. 10 is a flow chart showing a sequence of an embodiment of a method of forming a film according to the present invention;

FIGS. 12A to 12C are graphs respectively showing amounts of impurity in a polysilicon film formed on a wafer surface before and after a cleaning process is performed.

DETAILED DESCRIPTION OF THE PREFERRED EMBODIMENT

Figure 2:
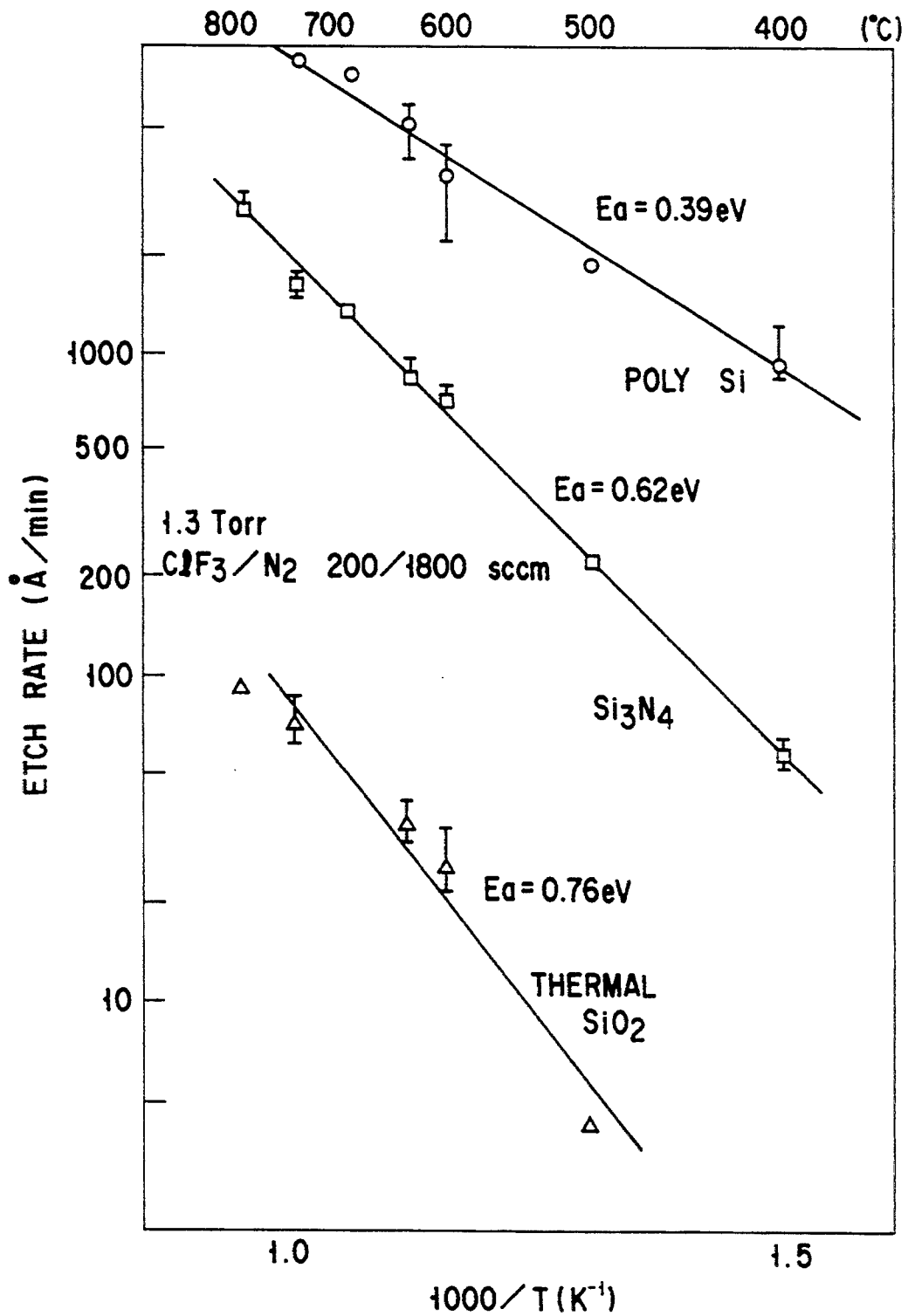
FIG. 2 is a graph showing relationships between temperatures and the etching rates of polysilicon, silicon oxide, and silicon nitride.

An embodiment in which a method of cleaning the inside of a reaction tube according to the present invention is applied to cleaning of a batch type vertical heat treatment apparatus will be described below with reference to the accompanying drawings.

First, the vertical heat treatment apparatus used in the present invention will be described below with reference to FIG. 1. A vertical heat treatment apparatus 1 has a reaction tube 2. The reaction tube 2 has a double structure including an outer tube 3 having an upper closed end and a lower opening end and an inner tube 4 coaxially arranged in the outer tube 3 with a predetermined interval and having upper and lower opening ends. The outer tube 3 and the inner tube 4 consist of a heat-resistant material such as quartz.

A heater 5, a heat-insulating material (not shown), and the like are arranged around the reaction tube 2 so as to surround the reaction tube 2.

The lower ends of the outer tube 3 and the inner tube 4 are supported by a manifold 6 consisting of stainless steel or the like. A disk-like cap portion 7 consisting of, e.g., stainless steel, is arranged at the lower opening end of the manifold 6 such that the cap portion 7 can freely be opened and closed. When the cap portion 7 is closed, the opening of the lower end portion of the manifold 6 is air-tightly closed by the cap portion 7.

A rotating shaft 8 extends through almost the central portion of the cap portion 7. The lower end portion of the rotating shaft 8 is connected to a lifting mechanism (not shown) and a rotating mechanism (not shown).

A heat-insulating cylinder 9 is arranged on the upper surface portion of the cap portion 7, and a wafer boat 10 is mounted on the heat-insulating cylinder 9. A plurality of semiconductor wafers 11 serving as objects to be processed are stacked and stored on the wafer boat 10 at a predetermined pitch. The wafer boat 10 consists of, e.g., quartz.

The cap portion 7, the heat-insulating cylinder 9, and the wafer boat 10 are integrally loaded by the above lifting mechanism. In this manner, the heat-insulating cylinder 9 and the wafer boat 10 are stored in the reaction tube 2, and the cap portion 7 air-tightly closes the lower opening end of the manifold 6.

A gas guide pipe 12 is arranged at a predetermined portion of the side wall of the manifold 6 to cause a gas outlet end 12a to linearly extend inside the manifold 6. A source gas supply system 13 and a cleaning gas supply system 14 are connected to the other end of the gas guide pipe 12 through switching valves 13a and 14a, respectively. Gases supplied to the reaction tube 2 are switched by the valves 13a and 14a.

The cleaning gas supply system 14 has a ClF$_3$ gas supply unit 15 serving as an etching gas source and an N$_2$ gas supply unit 16 for supplying an N$_2$ gas serving as a carrier gas for diluting a ClF$_3$ gas. The gas supply units 15 and 16 are connected to the gas guide pipe 12 through mass-flow controllers (MFCs) 17 and 18 and valves 19 and 20, respectively. A tape heater 22 is wound round a piping system 21 of the ClF$_3$ gas supply unit 15 to prevent the ClF$_3$ gas from being liquefied again in the pipe.

On the other hand, one end of a discharge pipe 23 is connected to the lower end portion of the reaction tube 2 so as to be open to the space between the outer tube 3 and the inner tube 4. A vacuum pump 24 is connected to the other end of the discharge pipe 23. A detoxification device 25 incorporating a chemical agent cylinder 26 storing chemical agents for absorbing or decomposing harmful or dangerous gases is connected to the discharge side of the vacuum pump 24.

At this time, an oil-free dry pump is preferably used as the vacuum pump 24 because of the following reason. That is, since a cleaning gas contains ClF$_3$, when an oil pump is used, pump oil may be often be degraded by the cleaning gas and a pump main body may often be degraded by pump oil or chlorine or fluorine mixed in the oil.

The step of forming a polysilicon film using the vertical heat treatment apparatus 1 and the step of cleaning the inside of the reaction tube will be described below.

The wafer boat 10 storing a large number of semiconductor wafers 11 each having a diameter of 5 inches is loaded in the reaction tube 2 heated to a process temperature, e.g., 450° C. to 650° C., preferably, 620° C. to 630° C., and more preferably, 620° C. At the same time, the reaction tube 2 is air-tightly closed by the cap portion 7.

A pressure in the reaction tube 2 is decreased to, e.g., $1 \times 10^{-3}$ Torr, and a source gas such as an SiH$_4$ gas is supplied from the gas guide pipe 12 into the reaction tube 2 at a predetermined flow rate. While a degree of vacuum is kept at 0.5 Torr, a polysilicon film is formed on the surface of each of the semiconductor wafers 11.

In this case, the source gas is supplied into the reaction tube 2 while the switching valve 13a of the source gas supply system 13 and the switching valve 14a of the cleaning gas supply system 14 are set in a closed state and an open state, respectively.

After the above film forming process is completed, a purge gas such as an H$_2$ or N$_2$ gas is supplied into the reaction tube 2 to purge the source gas in the reaction tube 2, so that the inside of the reaction tube 2 is set in a harmless atmosphere at an atmospheric pressure. The wafer boat 10 is unloaded from the reaction tube 2. At this time, the temperature in the reaction tube 2 is kept at the temperature of the film forming process.

In the film forming step, an Si-based film is deposited inside the reaction tube 2, i.e., the inner wall surface of the outer tube 3 or the inner and outer wall surfaces of the inner tube 4. In this case, the Si-based films include a polysilicon film (poly-Si), a amorphas silicon film (a-Si), or the like. The Si-based film is removed as follows. The reaction tube 2 is air-tightly closed by the cap portion 7, and a cleaning gas containing ClF$_3$ is supplied from the gas guide pipe 12 into the reaction tube 2 heated to a temperature of 450° C. to 650° C. The reaction tube 2 is kept at a predetermined pressure, so that the Si-based film deposited inside the reaction tube 2 is removed by etching using ClF$_3$.

In this case, the concentration of ClF$_3$ in the cleaning gas, the flow rate of the cleaning gas, and the pressure of the cleaning gas are set such that the etching rate of an Si-based film by the cleaning gas is higher than the etching rate of a material constituting the reaction tube at a portion to which the Si-based film is deposited, when the temperature in the reaction tube is set to be the process temperature, i.e., between 450° C. and 650° C.

Acceptable and most preferably conditions for forming a polysilicon film and cleaning inside of the reaction tube according to the present invention will be shown in Table 1.

TABLE 1

|  | Acceptable Range | Most preferably condition |
| --- | --- | --- |
| Temperature | 450° C. to 650° C. | 620° C. |
| Pressure | 0.3 to 5 Torr (Preferably 0.5 to 2 Torr) | 1 Torr |
| Concentration of ClF$_3$ | 10 to 50 vol. % | 20 vol. % |
| Flow rate of cleaning gas* | 1500 to 7000 SCCM | 3500 SCCM |
| Cleaning Time | 50 to 150 min. | 100 min. |
| Area of Object** |  | 2.1 m$^2$ |
| Thickness of Film |  | 10 μm |

*A concentration of ClF$_3$ in a cleaning gas is 20 vol. %.
**This is a total of an inner surface area of an outer tube and an inner and outer surface area of an inner tube.

Outer tube
Inner diameter 0.25 m
Length 1 m
Inner surface area 0.78 m$^2$
Inner tube
Inner diameter 0.21 m
Length 1 m
Inner and Outer surface area 1.32 m$^2$
Total 2.1 m$^2$ Each conditions shown in the Table 1 will be described in detail below.

First, as the cleaning gas, a gas obtained by diluting a ClF$_3$ gas with, e.g., a charge gas such as an Ar$_2$ or N$_2$ gas is used. FIG. 2 shows relationships between temperatures and the etching rates of polysilicon (poly-Si), Si$_3$N$_4$, and SiO$_2$ when cleaning is performed at a pressure of 1.3 Torr by using a cleaning gas containing ClF$_3$ having a concentration of 10 vol. %. As is apparent from FIG. 2, when the concentration of ClF$_3$ is less than 10 vol. %, the etching rate of the Si-based film is too low at the process temperature. On the other hand, when the concentration exceeds 50 vol. %, the material (e.g., quartz) constituting the reaction tube 2 and the like is etched to be damaged. The concentration of ClF$_3$ is most preferably set to be 20 vol. %.

The concentration of ClF$_3$ can be adjusted such that the flow rates of ClF$_3$ and N$_2$ gases are properly set by the MFCs 17 and 18 prior to a cleaning process.

Second, the total flow rate of the cleaning gas is dependent on the concentration of ClF$_3$ in the cleaning gas, the surface area inside the reaction tube 2, the thickness of the film and the condition of depositing the film. FIG. 3 shows relationships between gas flow rates and the etching rates of polysilicon and quartz. In this case, the concentration of ClF$_3$ in the cleaning gas is 10 vol. %, the temperature in the reaction tube 2 is 620° C., and the pressure in the reaction tube 2 is 1 Torr.

Third, FIG. 4 shows relationships between pressures and the etching rates of polysilicon and quartz. In this case, the concentration of ClF$_3$ in the cleaning gas is 20 vol. %, the temperature in the reaction tube 2 is 620° C., and the total flow rate of the cleaning gas is 3,500 SCCM [700/2,800 ClF$_3$/N$_2$ (SCCM/SCCM)]. As is apparent from FIG. 4, the etching rate of quartz is increased in proportion to an increase in pressure. In contrast to this, the etching rate of polysilicon is in inverse proportion to the pressure. Therefore, when a cleaning process is performed at a pressure lower than a pressure (to be referred to as a cross-point pressure hereinafter) (2.5 Torr in FIG. 4) at which the etching rate of quartz is equal to the etching rate of polysilicon, a polysilicon film deposited inside the reaction tube 2 can be removed by etching using ClF$_3$ without damaging the quartz constituting the reaction tube 2. From this point of view, the pressure in the reaction tube 2 in the cleaning process at the above process temperature is set to be 0.3 to 5.0 Torr, preferably, 0.5 to 2 Torr, and more preferably, 1 Torr, as shown in the Table 1.

Figure 5:
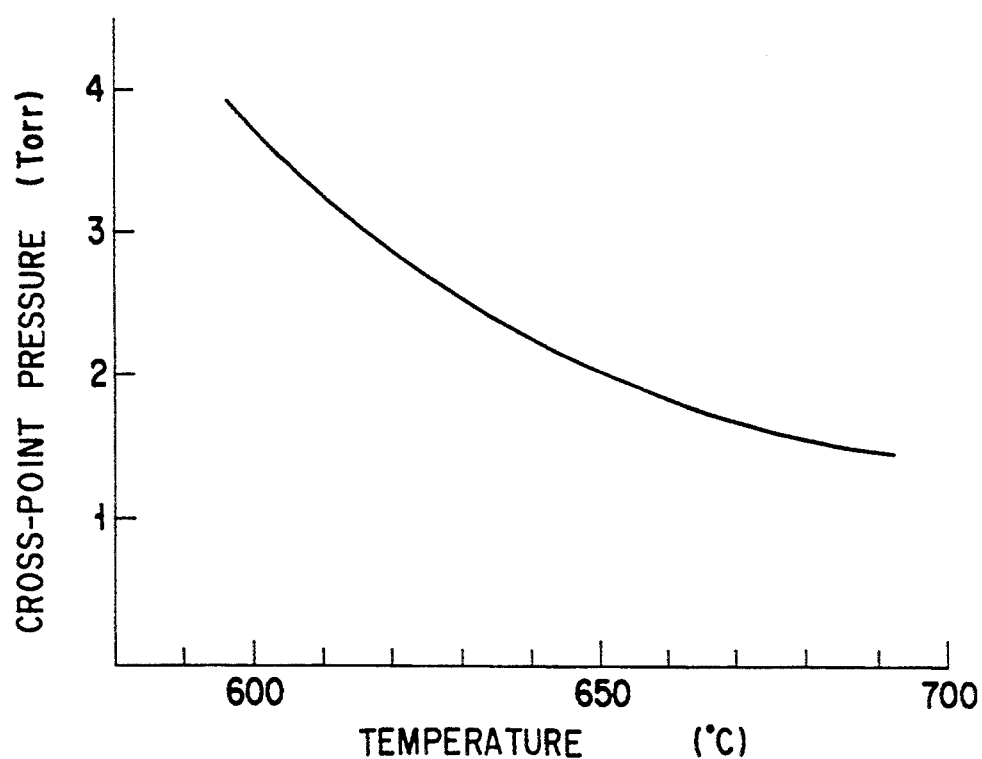
FIG. 5 is a graph showing a relationship between a cross-point pressure and a process temperature.
Figure 6:
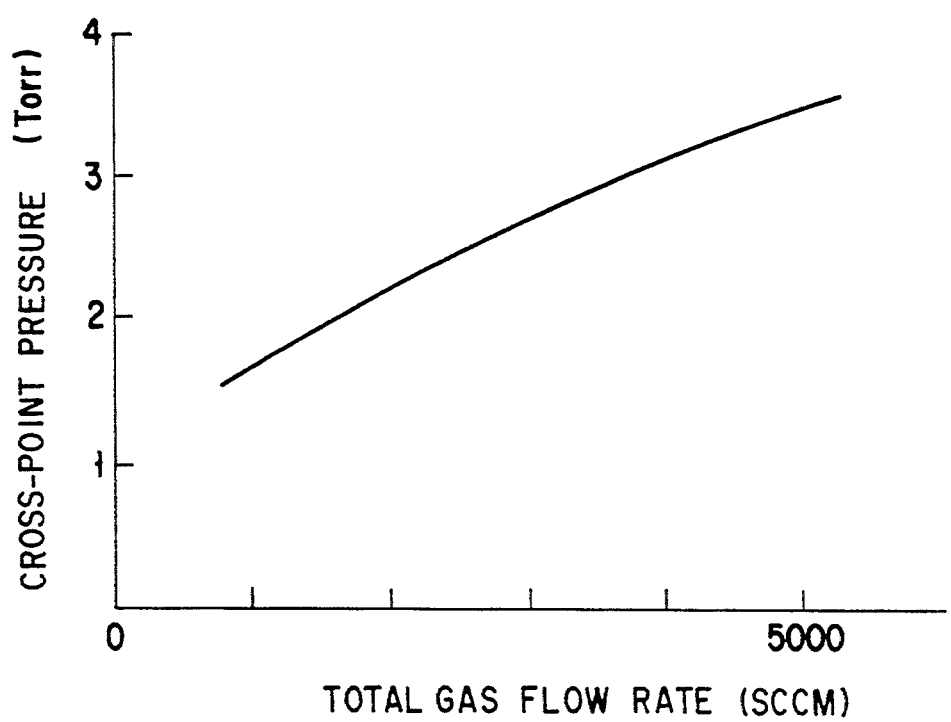
FIG. 6 is a graph showing a relationship between a cross-point pressure and a total gas flow rate.

However, the above cross-point pressure is changed depending on the temperature in the reaction tube 2, the concentration of ClF$_3$ in the cleaning gas, and the total flow rate of the cleaning gas. When the same conditions as described above are used except that the temperature in the reaction tube 2 is changed, a relationship between the cross-point pressure and the temperature is shown in FIG. 5. When the same conditions as described above are used except that the total flow rate of the cleaning gas is changed, a relationship between the cross-point pressure and the gas flow rate is shown in FIG. 6. As is apparent from FIG. 5, the cross-point pressure is in inverse proportion to the temperature in the reaction tube 2. As is apparent from FIG. 6, the cross-point pressure is in proportion to the total flow rate of the cleaning gas. The cross-point pressure is also influenced by the discharging ability of the vacuum pump 24. Therefore, the cleaning process is preferably performed such that the pressure is adjusted within the above range in consideration of these other factors.

Fourth, the processing time of the cleaning process (described as "cleaning time" below) is dependent on the concentration of ClF$_3$ in the cleaning gas, the surface area inside the reaction tube 2, the thickness of the film and the condition of the film deposited. When the conditions excepted from the cleaning time are same as that shown in the Table 1, the cleaning time can be selected in a range between 50 min. and 150 min. according to a size of the reaction tube 2, its material, a condition of the film forming process or the like. For example, under the most preferably condition as shown in the Table 1, all of the film deposited inside the reaction tube 2 can be removed by performing the cleaning process for 100 min.

The cleaning gas is supplied into the reaction tube 2 such that the switching valve 14a of the cleaning gas supply system 14 and the switching valve 13a of the source gas supply system 13 is set in open state and a closed state, respectively. At this time, since the gas outlet end 12a of the gas guide pipe 12 is arranged to linearly extend from the side wall surface of the manifold 6 toward the central axis of the inner tube 4 of the reaction tube 2, the supplied cleaning gas collides against the heat-insulating cylinder 9, the turbulent flow of the cleaning gas is formed in the reaction tube 2, and a portion opposite to the gas guide pipe 12 can be sufficiently cleaned.

For example, the following structure may be used. That is, the gas guide pipe 12 is bent upward to stand in the reaction tube 2, and a plurality of gas output ports are formed along the longitudinal direction of the standing pipe, so that the cleaning gas can be uniformly supplied to each wafer.

The cleaning gas may be continuously or intermittently supplied.

The cleaning gas containing ClF$_3$ is supplied into the reaction tube 2 under the above conditions to perform cleaning of the inside of the reaction tube 2. In this case, the Si-based film (i.e., the polysilicon film) deposited inside the reaction tube 2, e.g., the inner wall surface of the outer tube 3 and the inner and outer peripheral surfaces of the inner tube 4, can be removed at a sufficient etching rate without damaging quartz constituting the outer tube 3 and the inner tube 4. In addition, the cleaning can be performed while the temperature in the reaction tube 2 is kept at a temperature of 450° C. to 650° C. which is the temperature of the film forming process of a polysilicon film. For this reason, in shifting the film forming step to the cleaning step or shifting the cleaning step to the new film forming step, the temperature in the reaction tube 2 need not be increased and decreased. Therefore, a time required for the cleaning can be considerably decreased, and the operational efficiency of the heat treatment apparatus can be considerably improved. In addition, the cleaning process can be performed by etching using ClF$_3$ without producing a plasma.

Cleaning of the inside of the reaction tube 2 to remove a silicon-nitride-based film deposited inside the reaction tube 2 in the step of forming a silicon nitride film using the above vertical heat treatment apparatus 1 will be described below.

A film forming process of silicon nitride films on the surfaces of the wafers 11 is performed under the following conditions. For example, a source gas containing such as SiH$_4$, SiH$_2$Cl$_2$, and NH$_3$ is used, the temperature in the reaction tube 2 is 600° C. to 850° C., and the internal pressure in the reaction tube 2 is $1 \times 10^{-1}$ Torr. Other process operations are the same as those of the step of forming polysilicon as described above. Most preferably, the step of forming a silicon nitride film is performed under the following conditions. That is, a process temperature is 780° C., a pressure is 0.4 Torr, and a source gas containing SiH$_2$Cl$_2$ and NH$_3$ are supplied at a flow rate ratio of 90/900 SiH$_2$Cl$_2$/NH$_3$ (SCCM/SCCM).

In the same manner as described above, under the following conditions, a cleaning process of the inside of the reaction tube 2 is performed to remove a film deposited inside the reaction tube 2 in the step of forming a silicon nitride film.

Acceptable and most preferably conditions of a cleaning process in a film forming process according to the present invention will be shown in Table 2.

TABLE 2

|  | Acceptable Range | Most preferably condition |
| --- | --- | --- |
| Temperature | 550° C. to 650° C. | 620° C. |
| Pressure | 0.3 to 5 Torr (Preferably 0.5 to 2 Torr) | 1 Torr |
| Concentration of ClF$_3$ | 10 to 50 vol. % | 20 vol. %* |
| Flow rate of cleaning gas* | 1500 to 7000 SCCM | 3500 SCCM |

TABLE 2-continued

|  | Acceptable Range | Most preferably condition |
|---|---|---|
| Cleaning Time | 35 to 110 min. | 70 min. |
| Area of Object** |  | 2.1 m$^2$ |
| Thickness of Film |  | 5 μm |

*It is same as decided in Table 1
**It is same as decided in Table 1

Each conditions shown in the Table 2 will be described in detail below.

The temperature in the reaction tube 2 is set to be a temperature (more specifically, 550° C. to 650° C.) relatively lower than the above film forming process temperature, i.e., 600° C. to 850° C. As is apparent from FIG. 2, when the concentration of ClF$_3$ in the cleaning gas is 10 vol. %, an etching rate enough to etch the silicon nitride film cannot be obtained at a temperature lower than 550° C. On the other hand, when the temperature exceeds 650° C., the etching rate of quartz constituting the reaction tube 2 and the like is increased, thereby damaging the reaction tube 2 and the like.

The concentration of ClF$_3$ in the cleaning gas is determined within a range set such that, as in the above removal of the Si-based film, an etching rate enough to etch the silicon nitride film can be obtained at the temperature (550° C. to 650° C.) of the cleaning process and a material (e.g., quartz) constituting the reaction tube 2 and the like is not damaged by etching. More specifically, the concentration of ClF$_3$ falls within the range of 10 to 50 vol. %, and more preferably, 20 vol. %.

The total flow rate of the cleaning gas, as in the above removal of the Si-based film, is dependent on the concentration of ClF$_3$ in the cleaning gas, the surface are inside the reaction tube 2, the thickness of the film and the condition of the film deposited.

The pressure in the reaction tube 2 during the cleaning process, as in the removal of the Si-based film, is set such that the etching rate of a silicon nitride film is higher than the etching rate of quartz. That is, the cleaning process is performed at a pressure lower than the cross-point pressure. However, the cross-point pressure is changed depending on the temperature in the reaction tube 2, the concentration of ClF$_3$ in the cleaning gas, and the total flow rate of the cleaning gas. In addition, the cross-point pressure is also influenced by the discharging ability of the vacuum pump 24. Therefore, the cleaning process is preferably performed such that the pressure is adjusted within the above range in consideration of these factors.

The cleaning time is dependent on the concentration of ClF$_3$ in the cleaning gas, the surface area inside the reaction tube 2, the thickness of the film and the condition of the film deposited. When conditions except from the cleaning time are same that shown in the Table 2, the cleaning time can be selected in a range between 35 min. and 110 min. according to a size of the reaction tube 2, its material, a condition of the film forming process or the like. For example, under the most preferably condition as shown in the Table 2, all of the film deposited inside the reaction tube 2 can be removed by performing the cleaning process for 70 min.

When the cleaning process is performed under the above process conditions, a silicon-nitride-based film (i.e., the polysilicon nitride film) deposited inside the reaction tube 2 can be removed at a sufficient etching rate without damaging quartz constituting the reaction tube 2 and the like. When the temperature in the reaction tube 2 is slightly increased or decreased from the process temperature of 550° C. to 650° C. in the film forming process of a silicon nitride film, the cleaning process can be performed. For this reason, in shifting the film forming step to the cleaning step or shifting the cleaning step to the new film forming step, the temperature in the reaction tube 2 can be increased and decreased for a short time. Therefore, a time required for cleaning can be considerably shortened, and the operational efficiency of the heat treatment apparatus 1 can be remarkably increased.

Cleaning for removing a silicon oxide film deposited inside the reaction tube 2 in the step of a silicon oxide film using the vertical heat treatment apparatus 1 will be described below.

Silicon oxide films are formed on the surfaces of the wafers 11 under the following conditions. For example, a source gas containing such as SiH$_4$, SiH$_2$Cl$_2$, O$_2$, N$_2$O and alkoxysilane (Si(OC$_2$H$_5$)$_4$) is used, the temperature in the reaction tube 2 is 400° C. to 850° C., and the pressure in the reaction tube 2 is 1.0 Torr.

Other process operations are the same as those of the step of forming polysilicon.

In the step of forming the silicon oxide film, a cleaning process for removing a silicon-oxide-based film deposited inside the reaction tube 2 as in the removal of the Si-based film is performed.

The temperature in the reaction tube 2 is set to be 450° C. or more, preferably, 620° C. because of the following reason. That is, as is apparent from FIG. 2, when the concentration of ClF$_3$ in the cleaning gas is 10 vol. %, an etching rate enough to etch the silicon-oxide-based film cannot be obtained at a temperature lower than 450° C.

The concentration of ClF$_3$ in the cleaning gas is determined within a range set such that an etching rate enough to etch the silicon-oxide-based film is obtained at the process temperature (450° C. or more) of the cleaning process and the material constituting the reaction tube 2 and the like is not damaged by etching.

More specifically, the concentration is set within the range of 10 to 50 vol. %, and more preferably, 20 vol. %.

The cleaning process can be performed such that the total flow rate of the cleaning gas, as in the removal of the Si-based film, is set within the range, preferably, 3,000 to 3,500 SCCM, and more preferably, 3,500 SCCM.

The pressure in the reaction tube 2 during the cleaning process, as in the removal of the Si-based film described above, is set such that the etching rate of the silicon oxide film is higher than that of quartz. That is, the cleaning process is performed at a pressure lower than the cross-point pressure. More specifically, the pressure in the reaction tube 2 during the cleaning process at the above process temperature is set to be 0.5 Torr or less and more preferably, 1 Torr.

However, the cross-point pressure is changed depending on the temperature in the reaction tube 2, the concentration of ClF$_3$ in the cleaning gas, and the total flow rate of the cleaning gas. The cross-point pressure is also influenced by the discharging ability of the vacuum pump 24. Therefore, the cleaning process is preferably performed by adjusting the pressure within the above range in consideration of these factors.

Figure 7:
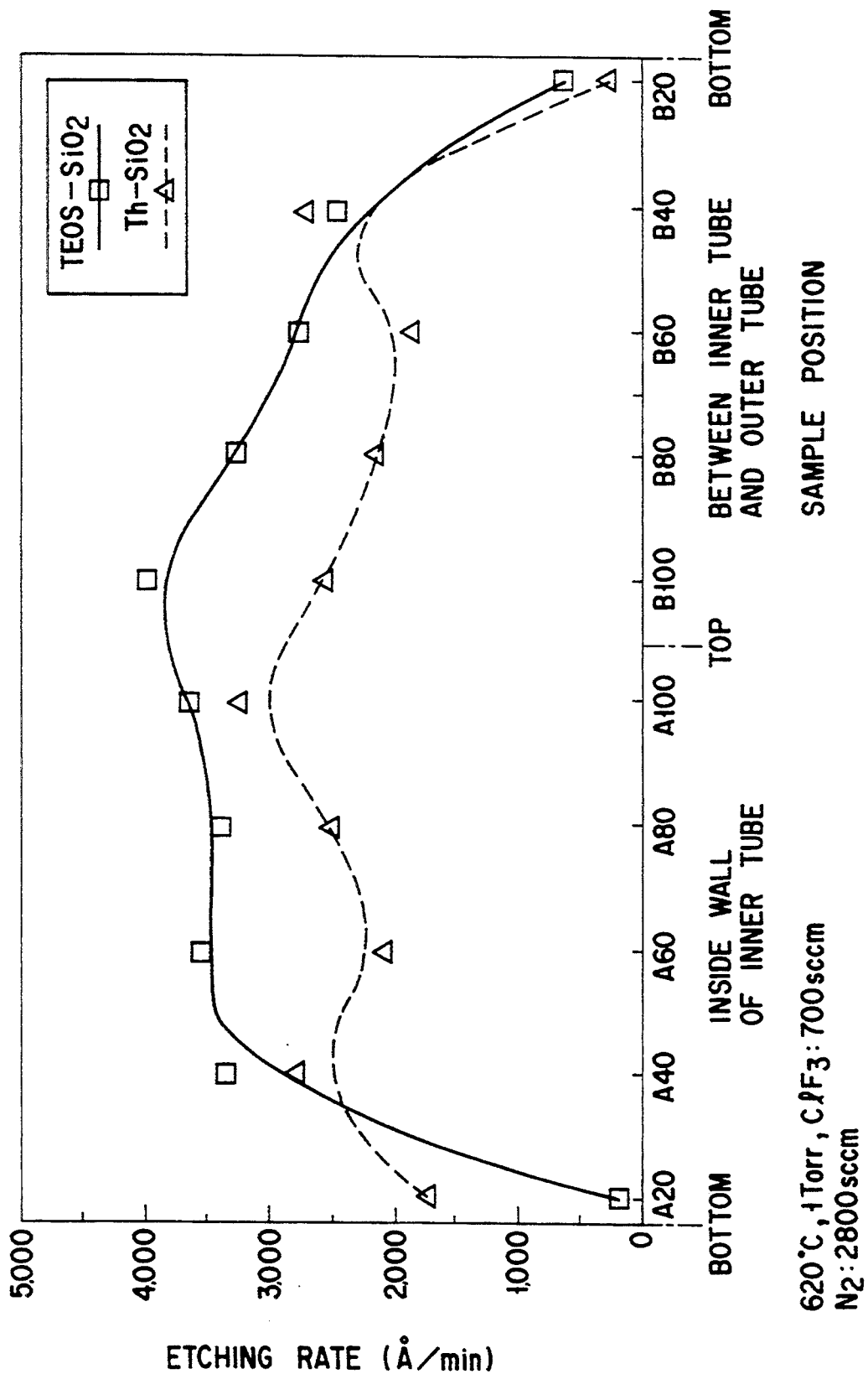
FIG. 7 is a graph showing relationships between the etching rates of silicon oxide and positions in the reaction tube.
Figure 8:
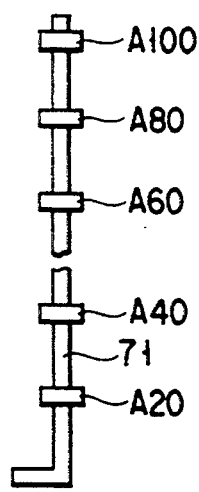
FIG. 8 is a schematic view showing a quartz rod used in tests of the embodiment.

FIG. 7 shows a dependency of the etching rate of silicon oxide on a position in the reaction tube. An example from which the results of FIG. 7 were obtained was performed as follows. That is, test piece wafers A20 to A100 on which silicon oxide films serving as samples were respectively formed were arranged at predetermined intervals on each of quartz rods 71 each having a bent low end portion and a height almost equal to the reaction tube, e.g., a rod having a height of 100 cm as shown in FIG. 8, these rods 71 were arranged on the inner wall of the inner tube 4 and in the space between the inner tube 4 and the outer tube 3, and a cleaning gas flowed in the reaction tube. At this time, cleaning conditions were set as follows. That is, the temperature in the reaction tube 2 was set to be about 620° C., the pressure was set to be about 1.0 Torr, the cleaning gas was obtained by mixing a ClF$_3$ gas at 700 SCCM and N$_2$ gas at 2,800 SCCM with each other, and the concentration of ClF$_3$ was set to be about 20 vol. %. A cleaning operation was performed for 1 minute. As silicon-oxide-based films serving as the samples, both a Th-SiO$_2$ film formed by thermal oxidation and a TEOS-SiO$_2$ film formed by CVD using alkoxysilane were used. According to FIG. 7, etching rates of 2,000 to 4,000 Å/min were obtained at all the positions except for the reaction tube position A20 at the lower end portion of the tube. More particularly, the etching rate of TEOS-SiO$_2$ was 3,000 to 4,000 Å/min. This rate is considerably higher than an etching rate obtained when a conventional NF$_3$ gas is used. In this manner, it was found that a cleaning operation could be efficiently performed by using a ClF$_3$ gas as a cleaning gas for a silicon-oxide-based film.

In this example, although the ClF$_3$ gas is diluted with an N$_2$ gas to obtain a ClF$_3$ gas having a concentration of 20 vol. %, this concentration may properly be changed.

As described above, when a cleaning operation for removing a silicon-oxide-based film is to be performed using a ClF$_3$ gas, the cleaning operation can be performed such that the temperature in the reaction tube 2 is set almost equal to the temperature, e.g., about 620° C., of film forming process of a silicon-oxide-based film on a semiconductor wafer. For this reason, in shifting the film forming step to the cleaning step, the temperature in the reaction tube need not be largely increased or decreased. In this case, even when the temperature in the reaction tube is increased or decreased, since the increase/decrease in temperature is small, both the steps are continuously performed.

Figure 9:
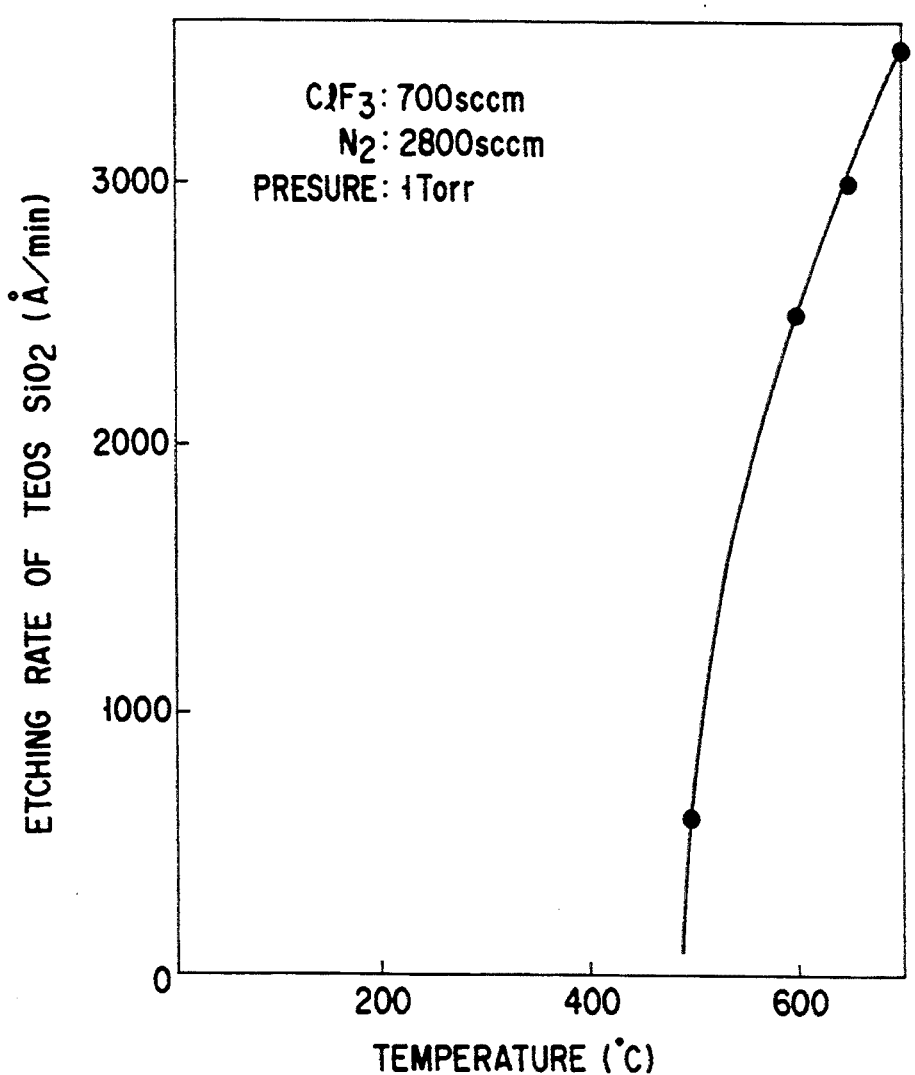
FIG. 9 is a graph showing the etching rate of TEOS-SiO$_2$ and a process temperature.

FIG. 9 shows a relationship between a temperature and an etching rate of when a cleaning process is performed such that a ClF$_3$ gas and an N$_2$ gas flow at flow rates of 700 SCCM and 2,800 SCCM, respectively, to keep the pressure in the reaction tube at 1 Torr. An etching rate of 600 Å/min can be obtained at a temperature of 500° C. However, at a temperature of 400° C., an etching rate is too small to be practically used. Therefore, the temperature of 450° C. or more is preferable.

In the above embodiments, cases wherein the present invention are applied to a film forming process have been described. The present invention can also be applied to a case wherein a film is deposited inside a process tube by, e.g., an etching process, an ashing process, or the like.

Results obtained by evaluating damages to the reaction tube 2 and the like caused by the above cleaning method will be described below.

A quartz jig on which a polysilicon film having a thickness of 10 μm was formed as sample was subjected to cleaning for 120 minutes in a furnace using a cleaning gas (carrier gas: N$_2$) having a concentration adjusted to 20 vol. % of ClF$_3$. The inside of the furnace was heated to 630° C., and the pressure in the furnace was 1.3 Torr. In this manner, the polysilicon film could be almost completely removed, and a decrease in thickness of the quartz jig was 6 to 10 μm. In addition, the quartz jig surface became rarely roughened. It was found that the reaction tube and the like were rarely damaged by the cleaning process.

A quartz jig on which a silicon nitride film having a thickness of 5 μm was formed as sample was subjected to cleaning for 80 minutes in a furnace using a cleaning gas (carrier gas: N$_2$) having a concentration adjusted to 20 vol. %. The inside of the furnace was heated to 630° C., and the pressure in the furnace was 1.5 Torr. In this manner, the polysilicon film could be almost completely removed, and a decrease in thickness of the quartz jig was 6 to 7 μm. In addition, the quartz jig surface became rarely roughened. It was found that the reaction tube and the like were rarely damaged by the cleaning process.

Dust produced in the film forming process to which a cleaning process was applied was evaluated. In this test, the following film forming process and the following cleaning process were performed in accordance with the flow chart shown in FIG. 10.

(i) A reaction tube consisting of quartz was cleaned by a diluted hydrogen fluoride (HF) solution (101).

(ii) A wafer boat in which cleaned 5-inch bare wafers were set at the lower, middle, and upper portions of the wafer boat was loaded in the reaction tube, an idle process was performed using an N$_2$ gas, and the wafer boat was unloaded. In this state, the number of particles each having a diameter of 0.3 μm or more and deposited on the surface of one bare wafer was counted. The average value of the numbers of particles each having a diameter of 0.3 μm or more and deposited on the surfaces of three bare wafers which were not subjected to the idle process was used as an initial value, and differences between the initial value and counted values were calculated as the numbers of increased particles (test A). The idle process was performed under the following conditions: a process temperature, 630° C.; a pressure in the reaction tube, 1.3 Torr; a process time, 30 minutes; and the flow rate of an N$_2$ gas, 1,000 SCCM. The test was repeated twice. The obtained results are indicated by A$_1$ and A$_2$ in FIG. 11, respectively.

(iii) The wafer boat was not loaded, and the inside of the reaction tube, i.e., the inner wall surface of the outer tube or the inner and outer wall surfaces of the inner tube, was coated with a polysilicon film having a thickness of 0.6 μm (102). This polysilicon film is called a pre-coat film. This pre-coat film was formed under the following conditions: a process temperature, 620° C.; a pressure in the reaction tube, 1 Torr; a film forming process time, 100 minutes; and a source gas flow rate ratio SiH$_4$ 120 SCCM.

(iv) In accordance with the same procedure as that of test A, the numbers of increased particles on the bare wafer surfaces were counted (test B). This test was repeated twice. The obtained results are indicated by B$_1$ and B$_2$ in FIG. 11.

(v) The wafer boat in which a plurality of wafers were set was loaded in the reaction tube, and a polysilicon film having a thickness of 10 μm was formed on each of the surfaces of the wafers (103). The polysilicon film was formed under the following conditions: a process temperature, 620° C.; a pressure in the reaction tube, 1 Torr; a film forming process timer 100 minutes; and a source gas flow rate ratio, SiH$_4$ 120 SCCM.

(vi) After the wafer boat was unloaded, the numbers of increased particles on the bare wafer surfaces were calculated in accordance with the same procedure as that of test A (test C). This test was repeated twice, and the obtained results are indicated by $C_1$ and $C_2$ in FIG. 11.

(vii) Subsequently, cleaning of the inside of the reaction tube was performed under the following conditions: a process temperature, 630° C.; a pressure in the tube, 1.3 Torr; a cleaning process time, 120 minutes; a flow rate, 3,500 SCCM; and the concentration of $ClF_3$, 20 vol. % (104).

(viii) After the wafer boat was loaded, the numbers of increased particles on the bare wafer surfaces in accordance with the same procedure as that of test A (test D). This test was repeated four times, and the obtained results are indicated by $D_1$ to $D_4$ in FIG. 11.

The above steps 102 to 104 were repeated four times. The obtained results are shown in FIG. 11.

Figure 11:
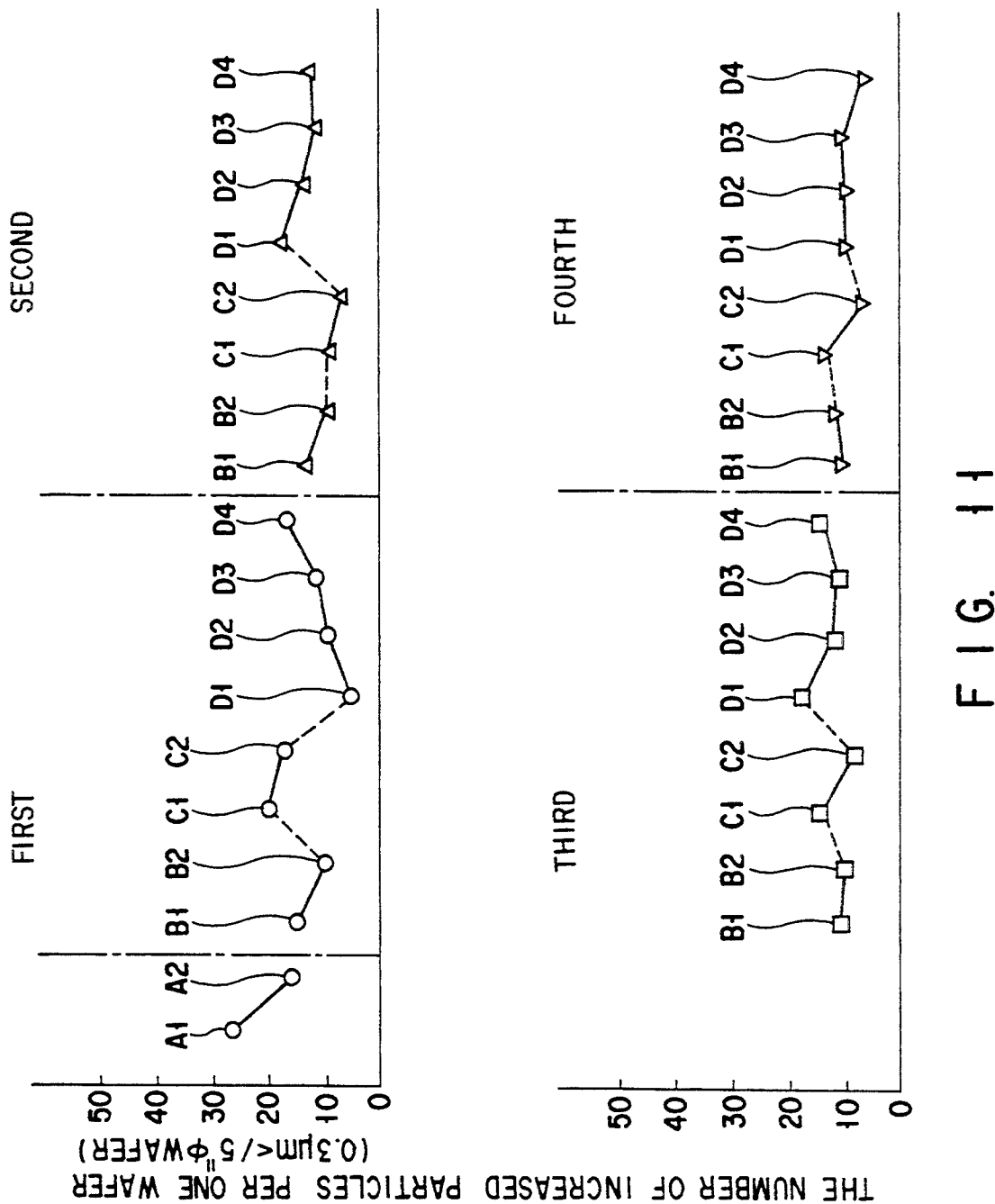
FIG. 11 show graphs showing the numbers of increased particles per wafer in the steps of the method of forming the film shown in FIG. 10.
Figures 13A, 13B, 13C:
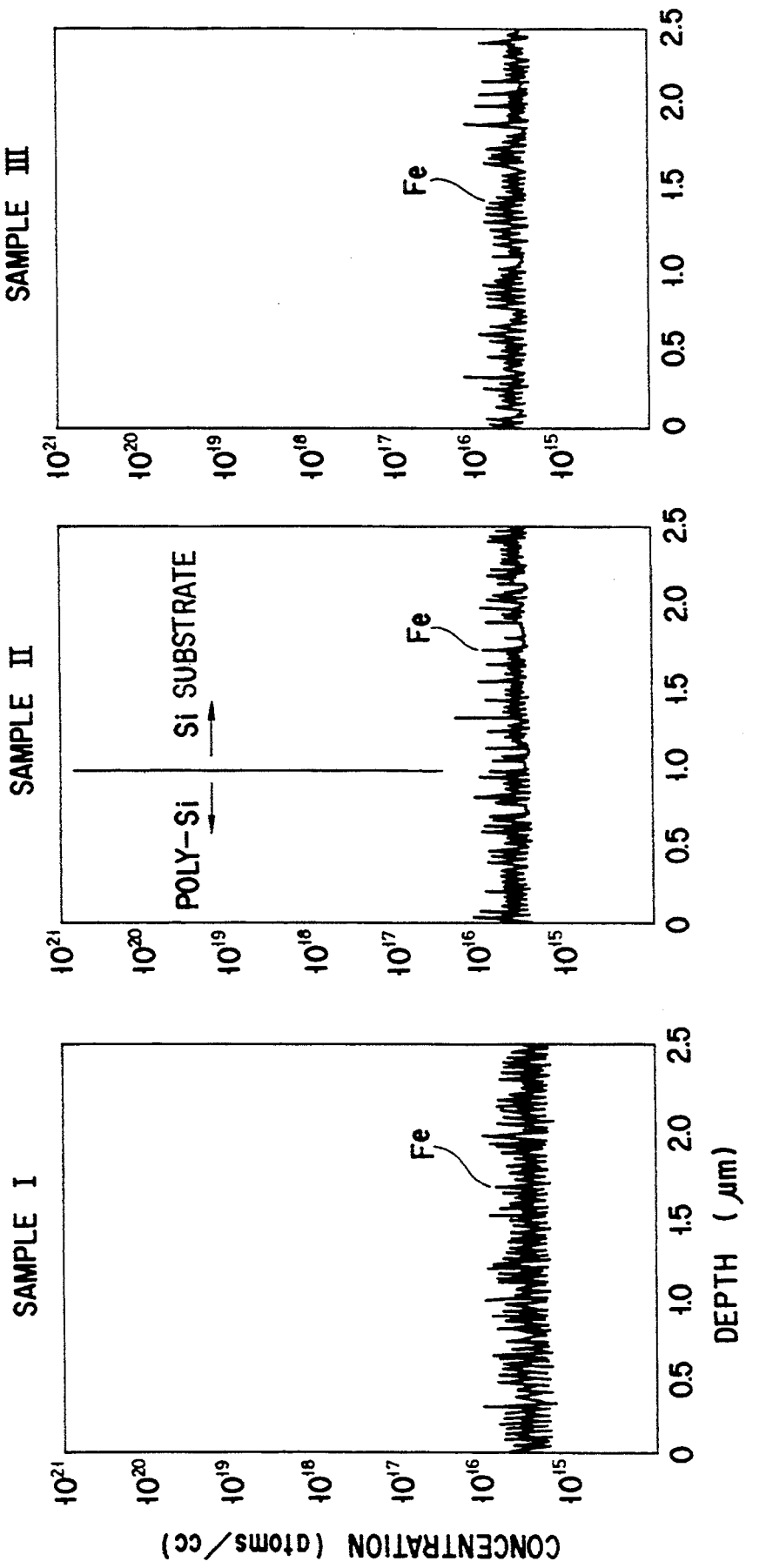
FIGS. 13A to 13C are graphs respectively showing amounts of impurity in a polysilicon film formed on a wafer surface before and after a cleaning process is performed.

As is apparent from FIG. 11, when the numbers $C_1$ and $C_2$ of increased particles obtained after the polysilicon film is formed were compared with the numbers $D_1$ to $D_4$ of increased particles obtained after the cleaning process was performed, significant differences were not recognized. Although some results ($D_1$ in the second and third tests) had the relatively large numbers of increased particles after the cleaning process was performed, the numbers were within an allowable range in a normal film forming process. As a result, it was confirmed that the cleaning process performed by etching using $ClF_3$ did not adversely affect a degree of cleanness of the inside of the reaction tube.

In the above tests, although a cleaning process is performed each time a film forming process is performed, the cleaning process may be performed after the film forming process is performed predetermined times.

Since a pre-coat film is formed by pre-coating process in step 102 on the inner wall surface of the outer tube or the inner and outer wall surfaces of the inner tube in the reaction tube subjected to the cleaning process, particles produced during the cleaning process and left on these wall surfaces are covered with the pre-coat film. For this reason, these particles are not removed from the surfaces in the film forming process step (103) which is to be performed to the wafer surfaces later, thereby preventing the particles from being deposited on the wafer surfaces.

An acceptable range and a most preferably thickness of the pre-coat film will be shown in Table 3.

TABLE 3

| | Acceptable Range | Most preferably thickness |
|---|---|---|
| Thickness of pre-coat film | 0.2 to 1 μm | 0.6 μm |

When the thickness of the pre-coat film is less than 0.2 μm, the particles produced by removing from the surface of quartz, which is toughened by etching of $ClF_3$, cannot be decrease sufficiently. On the other hand, when the thickness exceed 1 μm, the film forming time is extended and the amount of the used source gas becomes larger, as a result, loss of the source gas is occurred.

As a material for the pre-coat film, for example, polysilicon, silicon nitride, or, silicon oxide can be used. However, the material are not be limited by there and materials which are excellent in adhesive to a material (e.g., quartz) constituting the reaction tube or the like in the film forming process can be preferably used. More preferably, the same material as that of a film deposited on the wafer surface in the film forming step can be used.

As a matter of course, the pre-coating process, as described above, is performed when no wafer is present in the reaction tube after the cleaning process is performed. In addition, the pre-coating process includes the following processes. That is, in the film forming process step for the wafers, a film formed inside the reaction tube is left as a pre-coat film, and the next film forming process is performed.

Contamination occurring in the cleaning process was evaluated as follows.

(a) A polysilicon film having a thickness of 1 μm was deposited on the surface of a bare wafer, and this wafer was used as Sample I. This film forming process was performed under the following conditions: a process temperature, 620° C., a pressure in the reaction tube, 1.3 Torr; a film forming process time, 120 minutes; and a source gas flow rate ratio, $SiH_4$ 120 SCCM.

(b) Upon completion of step (a), the inside of the reaction tube was cleaned by using a cleaning gas containing $ClF_3$. This cleaning process was performed under the following conditions: a process temperature, 630° C.; a pressure in the reaction tube, 1.3 Torr; a cleaning process time, 120 minutes; a flow rate, 3,500 SCCM; and the concentration of $ClF_3$, 20 vol. %.

(c) Upon completion of the cleaning process in step (b), a polysilicon film having a thickness of 1 μm was deposited on the surface of another bare wafer under the same conditions as those of step (a), and this wafer was used as Sample II. At this time, a polysilicon film having a thickness of 1 μm formed inside the reaction tube was left as a pre-coat film.

(d) Upon completion of the film forming process in step (c), a polysilicon film having a thickens of 1 μm was deposited on the surface of still another bare wafer under the same conditions as those of step (a). This wafer was used as Sample III.

In Samples I to III obtained as described above, amounts of impurities (Cl, F, Fe) in the polysilicon films on Samples I to III were measured by a micro element analyzer (SIMS). The obtained results are shown in FIGS. 12A to 12C and FIGS. 13A to 13C, respectively.

As is apparent from FIGS. 12A to 12C and FIGS. 13A to 13C, when the amounts of impurities in the wafer (Sample I) subjected to the film forming process before the cleaning process was performed were compared with the amounts of impurities in the wafers (Samples II and III) subjected to the film forming process after the cleaning process was performed, significant differences were not recognized.

The results obtained by a test in which contamination occurring in wet-cleaning process using a conventional diluted HF solution is compared with contamination occurring in dry-cleaning process according to the present invention are shown in Table 4.

TABLE 4

| | SAMPLE | F | Cl |
|---|---|---|---|
| DRY-CLEANING | II | $1.7 \times 10^{13}$ | $4.0 \times 10^{10}$ |
| | III | $9.0 \times 10^{12}$ | $1.7 \times 10^{10}$ |
| | IV | $7.0 \times 10^{12}$ | $1.4 \times 10^{10}$ |
| WET-CLEANING | V | $4.1 \times 10^{12}$ | $1.2 \times 10^{11}$ |
| | VI | $2.8 \times 10^{12}$ | $5.8 \times 10^{10}$ |

TABLE 4-continued

| SAMPLE | F | Cl |
|---|---|---|
| VII | $1.9 \times 10^{12}$ | $2.1 \times 10^{10}$ |

*Unit; atoms/cm$^2$

In Table 4, Sample IV is obtained by performing the same film forming process as that in step (d) after forming a film whose thickness of 5 μm. Comparative Samples V to VII obtained by using wet-cleaning process correspond to Sample II to IV obtained by dry-cleaning process. Comparison Samples V to VII are obtained when the inside of the reaction tube 2 is cleaned, in accordance with a conventional method using a diluted HF solution, by wet-cleaning process in place of the dry-cleaning process using a cleaning gas containing ClF$_3$ in step (b).

As is apparent from Table 4, when Sample II to IV obtained by applying the dry-cleaning process using the cleaning gas containing ClF$_3$ were compared with Comparison Sample V to VII obtained by applying the wet-cleaning process using the diluted HF solution, significant differences between the amounts of impurities (F, Cl) in the polysilicon films on Sample II to IV and the amounts of impurities in the polysilicon films on Sample V to VII were not recognized.

As a result, it was confirmed that the cleaning process using ClF$_3$ according to the present invention causes no contamination in a film forming process.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of cleaning an inside of a reaction tube, comprising the steps of:

supplying a cleaning gas containing ClF$_3$ in a concentration of 10 to 50 vol. % into said reaction tube at a flow rate to remove a film deposited on an inner wall surface of said reaction tube or a surface of a member incorporated in said reaction tube by etching using the ClF$_3$;

maintaining the temperature in said reaction tube at not less than 450° C. while said cleaning gas is supplied; and setting a pressure condition such that the etching rate of the film being removed by the cleaning gas is higher than the etching rate of the material of said reaction tube or a member incorporated in said reaction tube, said film being selected from the group consisting of a polysilicon based film, a silicon nitride based film, and a silicon oxide based film.

2. A method according to claim 1, wherein a flow rate of the cleaning gas to an area of an object be processed falls within a range of 750 to 3500 SCCM/m$^2$.

3. A method according to claim 1, wherein a pressure falls within a range of 0.3 to 5 Torr.

4. A method according to claim 1, wherein when the film is the polysilicon-based film, a temperature in said reaction tube is 450° C. to 650° C., a flow rate of the cleaning gas to the area of the object be processed is 750 to 3,500 SCCM/m$^2$, and a pressure is 0.3 to 5 Torr.

5. A method according to claim 4, wherein the cleaning gas is supplied for 50 to 150 minutes.

6. A method according to claim 4, wherein when the film is the silicon-oxide-based film, a temperature in said reaction tube is 450° C. to 650° C., a flow rate of the cleaning gas to the area of the object be processed is 750 to 3,500 SCCM/m$^2$, and a pressure is 0.3 to 5 Torr.

7. A method according to claim 1, wherein when the film is the silicon-nitride-based film, a temperature in said reaction tube is 550° C. to 650° C., a flow rate of the cleaning gas to the area of the object be processed is 750 to 3,500 SCCM/m$^2$, and a pressure is 0.3 to 5 Torr.

8. A method according to claim 7, wherein the cleaning gas is supplied for 35 to 110 minutes.

* * * * *